United States Patent [19]

Ikeda

[11] Patent Number: 5,446,405

[45] Date of Patent: Aug. 29, 1995

[54] AMPLIFIER CIRCUIT WITH OFFSET CANCEL CIRCUIT

[75] Inventor: Chikaho Ikeda, Kanagawa, Japan

[73] Assignee: Fuji Xerox Co., Ltd., Tokyo, Japan

[21] Appl. No.: 154,477

[22] Filed: Nov. 19, 1993

[30] Foreign Application Priority Data

Nov. 20, 1992 [JP] Japan ................... 4-333905

[51] Int. Cl.⁶ .................. H03F 1/08; H03G 3/00
[52] U.S. Cl. .................. 327/362; 327/179; 330/9; 330/260
[58] Field of Search ............ 330/9, 259, 260, 293; 307/491, 493, 359; 327/73, 95, 179, 180, 307, 312, 323, 362, 560, 561

[56] References Cited

U.S. PATENT DOCUMENTS

| | | | |
|---|---|---|---|
| 4,255,715 | 3/1981 | Cooperman | 330/9 |
| 4,430,622 | 2/1984 | Simoes | 330/9 |
| 4,578,646 | 3/1986 | Maio et al. | |
| 4,962,328 | 10/1990 | Wöss et al. | 330/9 |
| 5,087,890 | 2/1992 | Ishiguro et al. | 330/9 |
| 5,229,720 | 7/1993 | Nishimura | 330/260 |

Primary Examiner—Timothy P. Callahan
Assistant Examiner—Eunja Shin
Attorney, Agent, or Firm—Finnegan, Henderson, Farabow, Garrett & Dunner

[57] ABSTRACT

In an amplifier circuit with an offset cancel circuit, on the output side of a non-inversion amplifier circuit, there is connected a sampling circuit including an analog switch composed of two MOS transistors. A source-follower circuit is connected to the output terminal of the sampling circuit. The output voltage of the source-follower circuit is applied to a series resistance formed between two resistances. A connecting point between the resistances is connected to the inversion input terminal of an operational amplifier forming the non-inversion amplifier circuit and thus the divisional component of the output signal of the source-follower circuit is applied to the inversion input terminal of the operational amplifier.

5 Claims, 4 Drawing Sheets

FIG. 3 PRIOR ART
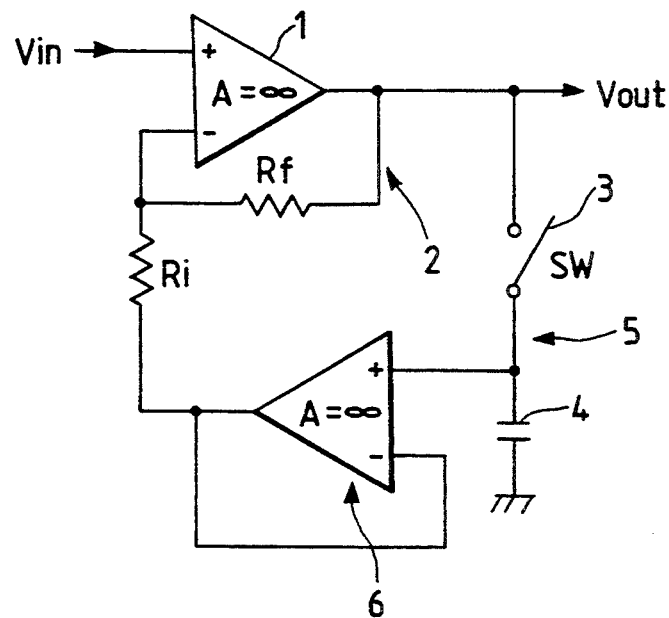
FIG. 4(a)
FIG. 4(b)
FIG. 4(c)
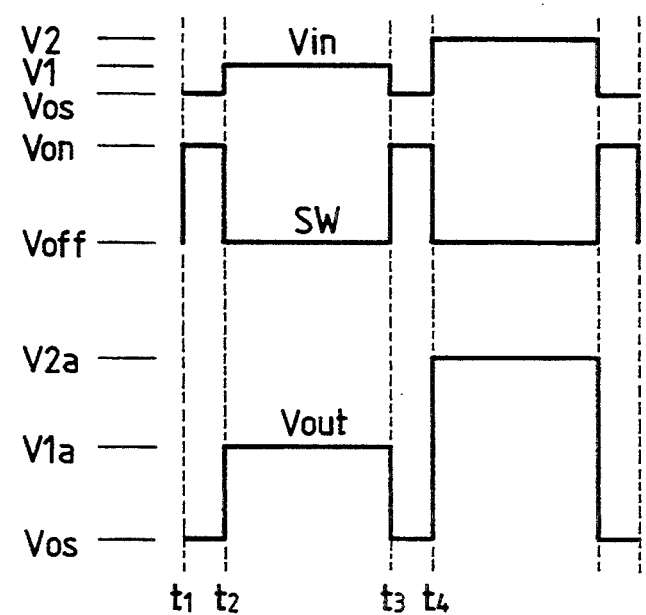

Vs DEPENDENCE OF DIFFERENTIAL RESISTANCE

|  | CONVENTIONAL CIRCUIT | PRESENT EMBODIMENT |
|---|---|---|
| DIFFERENTIAL GAIN WHEN Vin=2.5V | 100 TIMES | 100 TIMES |
| DIFFERENTIAL GAIN WHEN Vin=2.48V | 103 TIMES | 100.3 TIMES |
| DIFFERENTIAL GAIN WHEN Vin=2.52V | 96 TIMES | 99.6 TIMES |
| DIFFERENTIAL GAIN WHEN Vin=2.5V AND RESISTANCE VALUE IS INCREASED BY 20% | 114 TIMES | 101.4 TIMES |

AMPLIFIER CIRCUIT WITH OFFSET CANCEL CIRCUIT

BACKGROUND OF THE INVENTION

1. Field of the Invention

The present invention relates to an amplifier circuit which amplifies an output signal of a manuscript read element such as an image sensor and, in particular, to an amplifier circuit with an offset cancel circuit for removing an offset signal included in an input signal to improve the noise characteristic thereof.

2. Description of the Related Art

Conventionally, as an amplifier circuit with an offset cancel circuit of this kind, for example, as shown in FIG. 3, there is known an amplifier circuit in which an offset cancel circuit is arranged such that it feedbacks the output signal of the amplifier circuit through a sample hold circuit to the input terminal of the amplifier. That is, in FIG. 3, the amplifier circuit with an offset cancel circuit includes on the input side thereof a non-inversion amplifier circuit 2 including an operational amplifier 1 and, on the output side thereof, a sampling circuit 5 consisting of a sampling switch 3 and a sampling capacitor 4, and a buffer amplifier 6 for connecting the sampling circuit 5 with the terminal of the operational amplifier 1 on the reference potential side thereof, that is, the inversion input terminal thereof.

Now, in FIGS. 4 (a) through 4 (c), there is shown a timing chart which explains the operation of the above-mentioned conventional amplifier circuit. Description will be given below in general of the operation of this amplifier circuit with reference to FIG. 4. At first, as a premise, it is assumed that the input signal of the amplifier circuit is composed of a given offset voltage and, for example, the output signal of an image sensor superimposed on the offset voltage, and also that only the offset voltage is input just before the output signal of the image sensor superimposed on the offset voltage is input.

In other words, in the amplifier circuit, the sampling switch 3 is arranged such that it repeats ON/OFF operations at a given cycle. At first, if an offset voltage Vos is input from an external circuit (not shown) to the non-inversion input terminal of the operational amplifier 1 between times t1 and t2 (see FIG. 4 (a)), then the voltage Vos is output through the operational amplifier 1. Between times t1 and t2, the voltage Vos is applied to the sampling capacitor 4 through the sampling switch 3 in the closed state (see FIG. 4 (b)), with the result that the potential of the sampling capacitor 4 becomes Vos. On the other hand, due to negative feedback, the output impedance of the buffer amplifier 6 is sufficiently lower than a resistance Ri which connects the output terminal of the buffer amplifier 6 with the inversion input terminal of the operational amplifier 1 and, therefore, the output potential of the buffer amplifier 6 becomes substantially equal to the potential of the sampling capacitor 4, that is, it becomes substantially Vos.

Next, between times t2 and t3, if a constant voltage v1 composed of the offset voltage Vos and the output voltage of the image sensor superimposed on the voltage Vos is applied as an input signal Vin to the non-inversion input terminal of the operational amplifier 1, then a voltage, $Vos+((V1-Vos)\times(Rf/Ri+1))$, is output as an output voltage Vout from the output terminal of the operational amplifier 1.

Here, when the offset cancel circuit is not provided but only the non-inversion amplifier circuit 2 including the operational amplifier 1 is provided, if the offset voltage is included in the input signal similarly as described above, then the offset voltage Vos is amplified at the degree of amplification that is owned by the non-inversion amplifier circuit 2 before it is output. In particular, when only the offset voltage Vos is input, the output voltage of the non-inversion amplifier circuit 2 becomes $Vos\times(Rf/Ri+1)$.

In other words, by providing the offset cancel circuit, the offset voltage Vos can be restricted from $Vos\times(Rf/Ri+1)$ simply to Vos.

However, in the circuit shown in FIG. 3, while the sampling switch 3 is in the closed state, the non-inversion amplifier circuit 2 including the operational amplifier 1 is in the 100% negative feedback and the buffer amplifier 6 is included in the negative feedback loop, so that the non-inversion amplifier circuit 2 can be said that it is easy to generate oscillation. Therefore, in order to prevent such oscillation, there is known a method of applying a so-called capacity compensation to the operational amplifier 1 but, in this case, there arises a problem that the frequency characteristic of the circuit is lowered. Also, the noise that is produced in the buffer amplifier 6 is multiplied by Rf/Ri and then output by the non-inversion amplifier circuit 2 and, therefore, it is equivalent to the fact that the input noise of the non-inversion amplifier circuit is increased, with the result that the S/N ratio is lowered. Further, as the noise that is amplified in the non-inversion amplifier circuit 2, in addition to the noise that is generated in the buffer amplifier 6, noise is produced also in the sampling switch 3 and it is multiplied by Rf/Ri in the non-inversion amplifier circuit 2 similarly to the noise produced in the buffer amplifier 6, so that the effective dynamic range of the whole circuit is unfavorably reduced. Moreover, noise is further produced even in the operational amplifier 1 and thus, in order to reduce the noise level of the whole circuit, not only the operational amplifier to be used in the buffer amplifier 6 but also the operational amplifier forming the non-inversion amplifier circuit 2 must be composed of an operational amplifier which is expensive and of low noise, respectively. As a result of this, the whole circuit is expensive.

Thus, in view of the above-mentioned drawbacks found in the circuit shown in FIG. 3, especially, as a technology to reduce the number of expensive low-noise operational amplifiers used to thereby reduce the costs of the circuit, for example, as shown in FIG. 5, there is known a circuit which includes a source-follower circuit 7 using an n-channel MOS transistor instead of the above-mentioned buffer amplifier 6. In FIG. 5, the same components as those shown in FIG. 3 are given like reference numerals and characters, and the description thereof is omitted here. Description will be given below in general of the circuit with reference to FIG. 5.

In the circuit shown in FIG. 5, a source-follower circuit 7 includes an n-channel MOS transistor 8. The n-channel MOS transistor 8 includes a gate which is connected to a connecting point between the sampling switch 3 and sampling capacitor 4 and also includes a drain to which a drain voltage VD is to be applied. Further, the n-channel MOS transistor 8 further includes a source which is connected through a resistance Ri to the non-inversion input terminal of the operational amplifier 1 and which is connected to a constant current source 9.

However, in the circuit shown in FIG. 5, since no negative feedback is applied to the source-follower circuit 7 using the MOS transistor 8, unlike the buffer amplifier 6 described above, it can be assumed that the output impedance of the source-follower circuit 7 is a value which cannot be ignored with respect to the resistance Ri connected to the inversion input terminal of the operational amplifier 1. When the output impedance of the source-follower circuit 7 using the MOS transistor 8 is calculated by use of a known circuit analysis technique on trial, then the output impedance is obtained as follows (see FIG. 6 showing a basic structure used to analyze the source-follower circuit 7):

At first, as the conditions of the MOS transistor, if it is assumed that, in the channel direction thereof, the length of the transistor L=5 $\mu$m, the width thereof W=400 $\mu$m, the thickness of the oxidized film = 1000 Å (angstrom), and the mobility $\mu n = 800$ cm$^2$/V, then the drain current $I_{DSAT}$ in saturation can be obtained as follows: that is, $I_{DSAT}=(\mu n \times C_{OX} \times (W/L))/2 \times (VGS-VG)$, where $C_{OX}$ expresses the capacity of the oxidized film (F/m$^2$), VGS expresses a voltage between the gate and source, and Vt expresses a threshold value, respectively. Further, the differential output resistance of the source-follower can be obtained by differentiating the $I_{DSAT}$ with respect to Vs and, in FIG. 7, there is shown the thus obtained differential resistance using the $I_{DSAT}$ as a parameter. As shown in FIG. 7, it can be said that the differential resistance varies according to $I_{DSAT}$. The variations of the differential resistance are the values that cannot be ignored when compared with the resistance Ri connected to the inversion input terminal of the operational amplifier 1. As a result of this, it is easy to guess that the gain of the circuit shown in FIG. 5 is variable.

Here, let us find roughly and quantitatively to what degree the gain of the circuit shown in FIG. 5 varies. At first, when, with the input signal Vin=2.5 V, no current flows out of the source-follower circuit and the entirety of $I_{DSAT}$ flows into the current source 9, in FIG. 7 the differential resistance provides the output resistance of the source-follower circuit when $I_{DSAT}=100$ $\mu$A. Thus, for example, if it is assumed that Ri=506 $\Omega$ and Rf=198 k$\Omega$, then the ratio of amplification becomes 100 times. Under these conditions, if the input signal Vi is changed from, for example, 2.5 V, then a current flows out from the source-follower circuit, which causes the saturation drain current $I_{DSAT}$ to vary and thus causes the output resistance of the source-follower circuit as well. This incurs the variations of the circuit gain. In FIG. 8, there are shown the examples of the variations of the gain caused by the variations of the input signal Vin (see the columns for the conventional circuit in FIG. 8). From this result, it is easy to guess that the actual gain also varies considerably according to the input signal. As described above, in the conventional circuit, it has been impossible to supply a circuit which is inexpensive and has a stable amplifying characteristic.

SUMMARY OF THE INVENTION

The present invention aims at eliminating the problems found in the above-mentioned conventional amplifier circuit. Accordingly, it is an object of the invention to provide an amplifier circuit with an offset cancel circuit which is inexpensive and has a stable amplifying characteristic.

In attaining the above object, the invention provides an amplifier circuit with an offset cancel circuit, including a non-inversion amplifier circuit including an operational amplifier, a sampling hold circuit connected to an output terminal of the non-inversion amplifier circuit, a source-follower circuit interposed between an output terminal of the sampling hold circuit and an inversion input terminal of the operational amplifier forming the non-inversion amplifier circuit, a first resistance which connects an output terminal of the source-follower circuit with the inversion input terminal of the operational amplifier, and a second resistance having one end held at a constant potential and the other end connected with the inversion input terminal of the operational amplifier.

BRIEF DESCRIPTION OF THE DRAWINGS

The accompanying drawings, which are incorporated in and constitute a part of this specification, illustrate an embodiment of the invention and, together with the description, serve to explain the objects, advantages, principles of the invention. In the drawings.

FIG. 3 is a circuit diagram of an example of a conventional amplifier circuit with an offset cancel circuit;

FIGS. 4 (a) through 4 (c) are timing charts for explaining the operation of an amplifier circuit with an offset cancel circuit;

DETAILED DESCRIPTION OF THE PREFERRED EMBODIMENT

Figure 1:
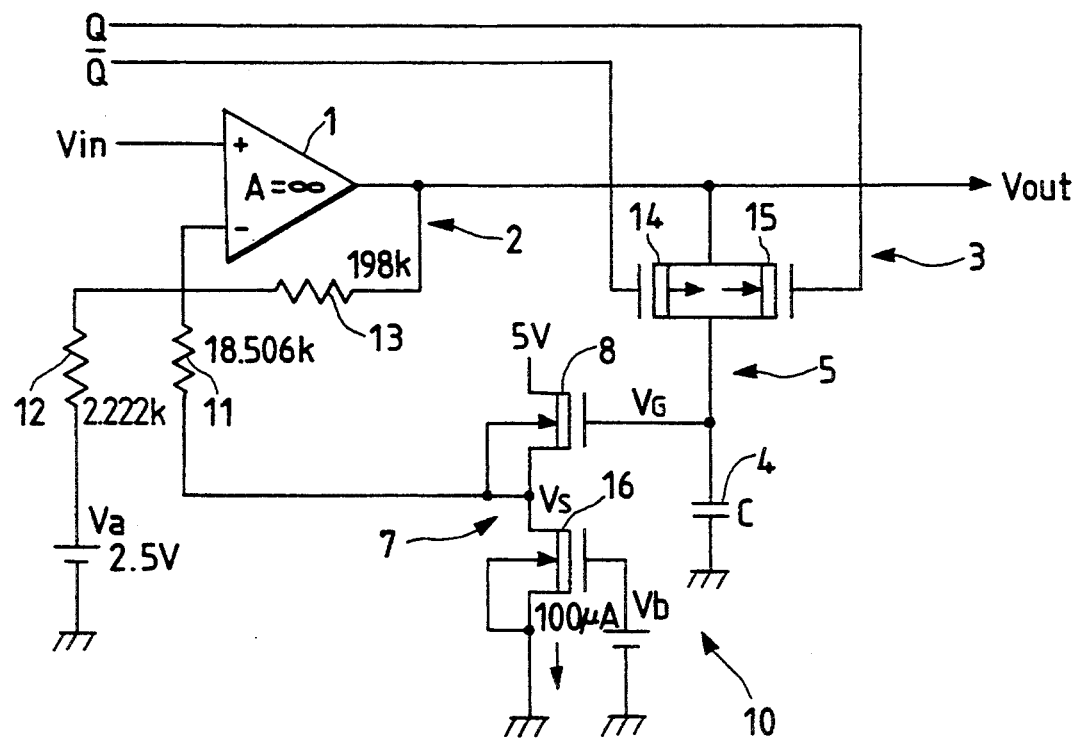
FIG. 1 is a circuit diagram of an embodiment of an amplifier circuit with an offset cancel circuit according to the invention.
Figure 2:
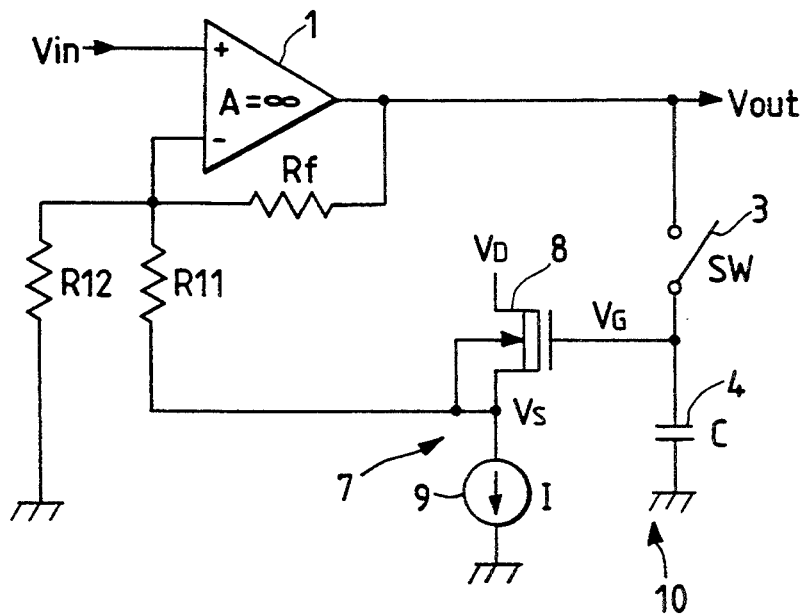
FIG. 2 is a circuit diagram of a basic structure of the amplifier circuit according to the invention.
Figure 5:
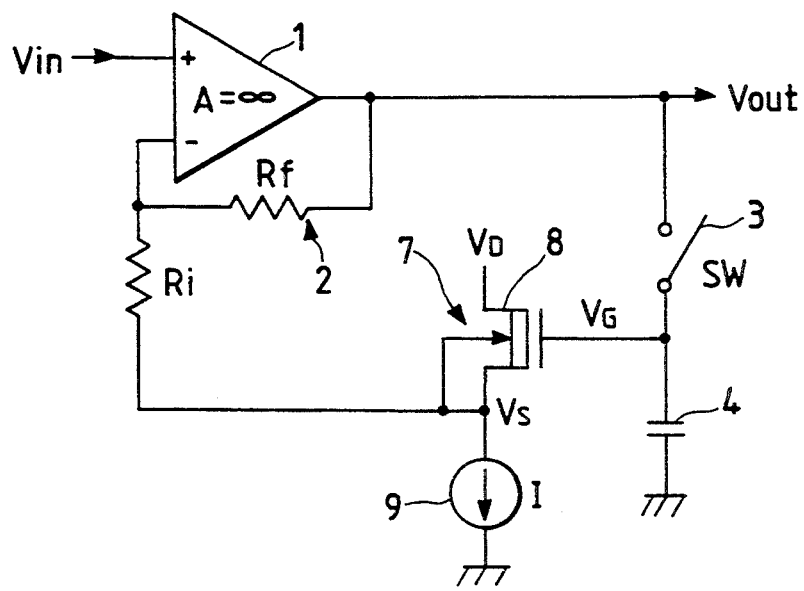
FIG. 5 is a circuit diagram of another example of a conventional amplifier circuit with an offset cancel circuit.
Figure 6:
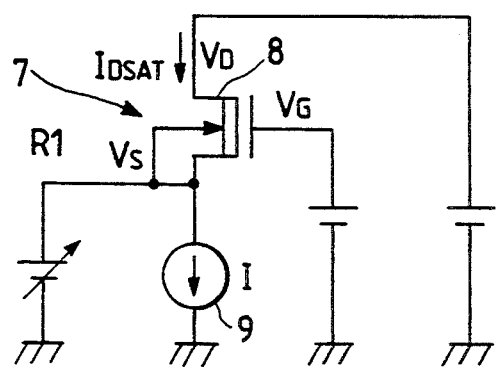
FIG. 6 is a circuit diagram of a basic structure used to analyze a source-follower circuit employed in the circuit shown in FIG. 5.

Description will be given hereinbelow of an amplifier circuit with an offset cancel circuit according to the invention with reference to FIGS. 1 and 2. Here, FIG. 1 is a circuit diagram which shows an embodiment of an amplifier circuit with an offset cancel circuit according to the invention, and FIG. 2 is a circuit diagram of an example of a basic structure of the amplifier circuit according to the invention. In the circuits shown in FIGS. 1 and 2, the same components as those of the conventional circuit shown in FIG. 5 are given the same reference numerals and characters, and thus the detailed description thereof is omitted here.

At first, the basic structure of the present circuit will be described below with reference to FIG. 2.

The circuit shown in FIG. 2 includes a non-inversion amplifier circuit 2 including an operational amplifier 1, and an offset cancel circuit 10 which includes a sampling circuit 5 and a source-follower circuit 7. Accordingly, the circuit shown in FIG. 2 has the same basic structure as that of the conventional circuit shown in FIG. 5. However, the present circuit is different from the conventional circuit shown in FIG. 5 in that the source of an n-channel MOS transistor 8 forming the source-follower circuit 7 is connected through a resistance 11 to the inversion input terminal of the operational amplifier 1 and also that the inversion input terminal of the operational amplifier 1 is grounded through a resistance 12. Here, the values of the resistances 11 and 12 are set in such a manner that, in the circuit shown in FIG. 5, at the time when the offset voltage Vos is input to the operational amplifier 1 (see a time period between times t1 and t2 in FIG. 4 (a)), the resistance value obtained by parallel connecting the resistance 12 and the composite resistance in which the output resistance of the source-follower circuit 7 and the resistance 11 are connected in series, is equal to the value of the resistance Ri in the conventional circuit shown in FIG. 5. In this structure, if the offset voltage Vos is input to the operational amplifier 1 as shown in FIG. 4 (a), then the offset voltage Vos is divided by the output resistance of the source-follow circuit 7 and the resistance 11 on the output side of the source-follower circuit 7 and, therefore, the voltage Vs is reduced according to the division ratio thereof. Thus, the output resistance value of the source-follower 7, which depends on the variations of the voltage Vs, is also reduced, with the result that the variations of a so-called differential gain are reduced.

In FIG. 1, there is shown a more concrete embodiment of the amplifier circuit with an offset cancel circuit according to the invention. Now, description will be given below of the present concrete embodiment with reference to FIG. 1.

In FIG. 1, at first, in the non-inversion amplifier circuit 2 composed mainly of the operational amplifier 1, a resistance 13 is connected between the output terminal and inversion input terminal of the operational amplifier 1, and the value of the resistance 13 is set for 198 k$\Omega$. Also, one end of the resistance 12 is connected to the inversion input terminal of the operational amplifier 1, while a reference voltage Va is applied to the other end of the resistance 12. Here, the resistance 12 is set for 2.222 k$\Omega$ and the reference voltage Va is set for 2.5 V which is equal to the offset voltage vos to be input to the non-inversion input terminal of the operational amplifier 1.

On the other hand, in the sampling circuit 5, the sources of p- and n-channel MOS transistors 14 and 15 are grounded through a sampling capacitor 4 and the drains of the two MOS transistors 14 and 15 are respectively connected to the output terminal of the operational amplifier 1. Also, a logical signal Q is input to the gate of the n-channel MOS transistor 15, whereas an inverted logical signal, which is an inverted version of the logical signal Q, is input to the gate of the p-channel MOS transistor 14. The two MOS transistors 14 and 15 cooperate with each other in forming a so-called analog switch. That is, when the logical signal Q is a logical value 1, the two MOS transistors 14 and 15 are rendered conductive so that the output terminal of the operational amplifier 1 is connected with the sampling capacitor 4. On the other hand, when the logical signal Q is a logical value 0, the two MOS transistors 14 and 15 are rendered non-conductive so that the sampling capacitor 4 is electrically disconnected from the non-inversion amplifier circuit 2.

Further, the source-follower circuit 7 is composed of two n-channel MOS transistors 8 and 16 which are connected in series with each other. A DC voltage of 5 V is applied to the drain of the one n-channel MOS transistor 8, while the source of the other n-channel MOS transistor 16 is grounded. Also, the gate of the n-channel MOS transistor 8 is connected to the sampling capacitor 4. Further, a DC voltage Vb is applied to the gate of the n-channel MOS transistor 16 so that a current of 100 $\mu$A flows in the n-channel MOS transistor 16 as a drain current. Thus, the n-channel MOS transistor 16 serves as the current source 9 in the conventional circuit shown in FIG. 5. Furthermore, a connecting point between the source of the n-channel MOS transistor 8 and the drain of the n-channel MOS transistor 16 is connected through the resistance 11 to the inversion input terminal of the operational amplifier 1. Here, the resistance 11 is set for 18.506 k$\Omega$.

In the above-mentioned structure, the operation of the circuit is basically the same as that of the conventional circuit previously described with reference to FIGS. 3 and 4, and thus description of the present circuit will be given only in general with reference to FIG. 4 here.

In the circuit shown in FIG. 1, the sampling switch 3, which is composed of the n- and p-channel MOS transistors 14 and 15, is arranged so as to repeat the conductive state at a given cycle. That is, between times t1 and t2, and between times t3 and t4 (see FIG. 4 (a)), during which the logical signal Q having a logical value 1 is input to the gate of the n-channel MOS transistor 15 and the logical signal having a logical value 0 (that is, an inverted version of the logical signal Q) is input to the gate of -the p-channel MOS transistor 14, the sampling switch 3 is rendered conductive in the respective periods to sample the output signal of the operational amplifier 1, and the sampled signal is then input to the sampling capacitor 4.

At first, between times t1 and t2, the offset voltage Vos is applied to the non-inversion input terminal of the operational amplifier 1 and thus the sampling capacitor 4 is charged such that the potential of the inversion input terminal thereof is equal to the offset voltage Vos. Next, between times t2 and t3, if there is input the input voltage V1 composed of the offset voltage Vos and the output signal of an image sensor (not shown) superimposed on the offset voltage Vos, then an output voltage, $V1a = Vos + (V1 - Vos) \times (Rf/Ri + 1)$, is output from the output terminal of the operational amplifier 1. Here, the resistance Ri has a composite value which is obtained by combing a series resistance value between the output resistance of the source-follower circuit 7 and the resistance 11 with the resistance value of the resistance 12. At and after time t3 as well, the operation is essentially similar except that the output voltage of the image sensor (not shown) superimposed on the offset voltage Vos is different. That is, basically, the same operation as at and from time t1 is repeated and thus the detailed description thereof is omitted here.

In the embodiment shown in FIG. 1, a ratio of the resistance 12 with respect to the composite value of the resistance 11 and the output resistance of the source-follower circuit 7 is substantially 10. For this reason, even if noise is superimposed on the output signal of the source-follower circuit 7, the magnitude of the noise in the resistance 12 is reduced to 1/10 or so at the voltage level and to 1/100 or so at the power level, so that the level of the noise is sufficiently small with respect to the input noise of the operational amplifier 1.

Figures 7, 8:
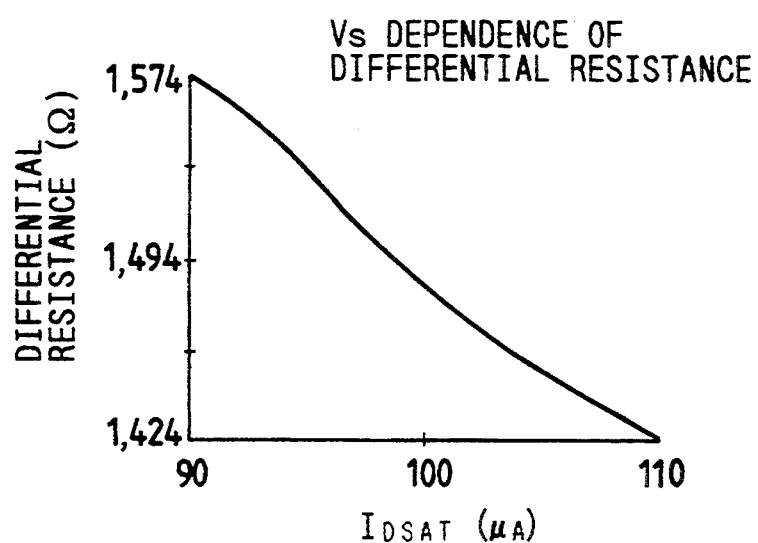
FIG. 7 is a characteristic view showing a relationship between a differential resistance and a source voltage employed in the conventional circuit.
FIG. 8 is an explanatory view for explaining differences between differential gains respectively obtained by the circuit according to the embodiment and the conventional circuit.

In FIG. 8, there is shown an explanatory view which is used to explain differences between so-called differential gains respectively obtained by the above-mentioned structure and the conventional circuit. That is, in FIG. 8, the differential gains shown in the columns for the present embodiment are calculated according to a method which uses a differential resistance in the source-follower circuit 7 as an output resistance, similarly to the method according to which the differential gains in the conventional circuit shown in FIG. 5 were calculated.

That is, at first, when the input voltage of the operational amplifier 1 is 2.5 V, the differential gain in the present embodiment is 100 times. When the input voltage is 2.48 V, the differential gain is 100.3 times and, when the input voltage is 2.52 V, the differential gain is 99.6 times. This means that the differential gain varies little. Further, if resistances used in an integrated circuit are all varied or increased by 20% and the output resistance of the source-follower circuit remains unchanged, the differential gain is 101.4 times when the composite value of the resistance 11 with the output resistance of the source-follower circuit 7 is increased by 20%. In this case as well, it can be said that the gain variation is substantially small.

As has been described heretofore, according to the invention, in an amplifier circuit with an offset cancel circuit including a source-follower circuit in a feedback circuit, the output signal of the source-follower circuit is divided by resistances and is then applied to the input of a non-inversion amplifier circuit, so that even if the output impedance of the source-follower circuit varies, the amount of variation transmitted to the input of the non-inversion amplifier circuit can be restricted according to the resistance division ratio. Therefore, unlike the conventional circuit, according to the invention, it is possible to supply an amplifier circuit with an offset cancel circuit which provides a high gain accuracy and a low noise while using a source-follower circuit in the feedback loop.

What is claimed is:

1. An amplifier circuit with an offset cancel circuit, comprising:
   a non-inversion amplifier circuit including an operational amplifier and a feedback resistance connected between an inversion input terminal and an output terminal of said operational amplifier an input to the non-inversion side of said non-inversion amplifier circuit;
   a sampling hold circuit connected to an output terminal of said non-inversion amplifier circuit;
   a source-follower circuit interposed between an output terminal of said sampling hold circuit and an inversion input terminal of said operational amplifier forming said non-inversion amplifier circuit;
   a first resistance which connects an output terminal of said source-follower circuit with the inversion input terminal of said operational amplifier; and
   a second resistance having one end held at a constant potential and the other end connected with the inversion input terminal of said operational amplifier.

2. The amplifier circuit as set forth in claim 1, wherein a composite resistance value obtained when said second resistance is connected in parallel with a series resistance formed between said first resistance and an output resistance of said source-follower circuit is equal to a resistance value of a resistance when the inversion input terminal of said operational amplifier is connected with said source-follower circuit by means of said resistance.

3. The amplifier circuit as set forth in claim 1, wherein a value of a series resistance between said first resistance and an output resistance of said source-follower circuit is set two times or more than that of said second resistance, and a value of a feedback resistance of said operational amplifier is set two times or more than a composite resistance value obtained when said second resistance is connected in parallel with a series resistance formed between said first resistance and an output resistance of said source-follower circuit.

4. The amplifier circuit as set forth in claim 1, wherein a potential to be applied to one end of said second resistance is set substantially equal to an offset voltage included in an input signal of said non-inversion amplifier circuit.

5. The amplifier circuit as set forth in claim 1, wherein said sampling hold circuit includes an analog switch openable and closable in accordance with a logical signal and a capacitor connected in series with said analog switch, said capacitor being connected through said analog switch to the output terminal of said non-inversion amplifier circuit.

* * * * *